(12) United States Patent
Arasawa et al.

(10) Patent No.: US 7,479,655 B2
(45) Date of Patent: Jan. 20, 2009

(54) SEMICONDUCTOR DEVICE

(75) Inventors: Ryo Arasawa, Kanagawa (JP); Tomoyuki Iwabuchi, Kanagawa (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 0 days.

(21) Appl. No.: 11/657,163

(22) Filed: Jan. 24, 2007

(65) Prior Publication Data
US 2007/0178614 A1 Aug. 2, 2007

(30) Foreign Application Priority Data
Jan. 31, 2006 (JP) ............................. 2006-022074

(51) Int. Cl.
*H01L 21/66* (2006.01)
(52) U.S. Cl. .......................... 257/48; 438/14; 438/17; 257/E27.111; 257/E27.113
(58) Field of Classification Search .................. 438/17, 438/18; 258/48; 324/770, 753; 257/48
See application file for complete search history.

(56) References Cited

U.S. PATENT DOCUMENTS 6,887,724 B2    5/2005    Nakamura et al.

| 2004/0018677 | A1* | 1/2004 | Nakanishi et al. ............ 438/222 |
| 2005/0095735 | A1* | 5/2005 | Fujita ........................... 438/17 |
| 2005/0196883 | A1 | 9/2005 | Asano et al. |
| 2006/0270073 | A1 | 11/2006 | Isobe |

FOREIGN PATENT DOCUMENTS

JP    2004-341216    12/2004

\* cited by examiner

*Primary Examiner*—W. David Coleman
*Assistant Examiner*—Shaka Scarlett
(74) *Attorney, Agent, or Firm*—Cook Alex Ltd.

(57) ABSTRACT

An object of the invention is to manage variation of electrical characteristics of an element in a semiconductor device due to a vapor deposition process by measuring electrical characteristics of a TEG. A substrate 100 of an active matrix EL panel includes a vapor deposition region 101 having a film formed by a vapor deposition method. In the vapor deposition region 101, a pixel region 102 is provided. A TEG 109 is provided in the vapor deposition region 101 having a film formed in a vapor deposition step and outside of the pixel region 102. A measurement terminal portion 110 for measuring the TEG 109 is provided outside of a sealing region 103.

16 Claims, 10 Drawing Sheets

SEMICONDUCTOR DEVICE

BACKGROUND OF THE INVENTION

1. Field of the Invention

The present invention relates to a semiconductor device manufactured through a process of forming a film by a vapor deposition method.

2. Description of the Related Art

In recent years, a liquid crystal display device and an electro-luminescence (hereinafter referred to as EL) display device, in each of which transistors, specifically, thin film transistors (hereinafter referred to as TFTs) or MOS transistors are formed over one substrate, have been developed. These display devices are formed by providing a transistor formed over a glass substrate by a thin-film formation technique in each of pixels arranged in matrix, thereby functioning to display an image.

A Test Element Group (hereinafter referred to as TEG) for testing characteristics of a thin film transistor arranged in a pixel is provided in a region other than that of the pixel, over a substrate (see Patent Document 1).

[Patent Document 1] Japanese Published Patent Application No. 2004-341216

SUMMARY OF THE INVENTION

In an EL display device, a TFT is formed in a pixel first, and then a light emitting element is formed. Therefore, an effect to the TFT due to formation of the light emititng element needs to be tested. However, since a TEG of Patent Document 1 is provided outside of a region where a film is formed through a vapor deposition process, it is impossible to test variation of characteristics of the TFT due to formation of the light emitting element.

A vapor deposition method is used for forming a conductive film to be an electrode of an EL element or a film to be a light emitting layer; however, a defect may be caused in a threshold voltage (Vth) of a TFT or subthreshold characteristics before or after a vapor deposition process. The defect is caused because a gate insulating film is damaged by radiation generated in the vapor vepositon process, whereby a charge and a level are generated in the gate insulating film, and thus the TFT is deteriorated. Therefore, a TEG capable of testing electrical characteristics of a TFT in a pixel before or after a vapor deposition process is required.

An object of the invention is to manage variation of electrical characteristics of an element in a semiconductor device due to a vapor deposition process by measuring electrical characteristics of a TEG.

Further, electrical characteristics of a TFT may vary over time because the TFT keeps to operate. The electrical characteristics vary also due to temperature. Therefore, a display device that normally operates at room temperature cannot operate normally at high temperature or low temperature in some cases. Even after a pixel region is sealed, it is desired that the electrical characteristics of the TFT in the pixel region be managed.

An object of the invention is to provide a semiconductor device capable of measuring electrical characeristics of a TEG even after the pixel region is sealed.

One mode of the invention is a semiconductor device including a substrate defining a first region and a second region including a pixel provided in the first region; an element provided in the second region; a test element group for testing the element in the second region, which is provided in the first region outside of the second region; and at least one terminal which is provided outside of the first region, and electrically connected to the test element group.

The aforementioned mode of the invention is the semiconductor device including a substrate defining a vapor deposition region (also referred to as a first region) having a film formed by a vapor deposition method and a pixel region (also referred to as a second region) provided in the vapor deposition region; an element provided in the pixel region; a test element group for testing the element in the pixel region, which is provided in the vapor deposition region outside of the pixel region; and at least one terminal which is provided outside of the vapor deposition region, and electrically connected to the test element group.

Another mode of the invention is a semiconductor device including a substrate defining a vapor deposition region having a film formed by a vapor deposition method and a pixel region provided in the vapor deposition region; a pixel provided in the pixel region; a test element group for testing the element in the pixel region, which is provided in the vapor deposition region outside of the pixel region; and at least one terminal which is provided outside of the vapor deposition region and electrically connected to the test element group. The pixel has a first pixel circuit and a light emitting element connected to the first pixel circuit; the test element group has a second pixel circuit which is the same as the first pixel circuit; and at least one element of the second pixel circuit is electrically connected to the terminal.

Another mode of the invention is a semiconductor device including a pixel region including a first pixel circuit which has a first transistor, a second transistor, a gate signal line, a data signal line, and a power source line; and a light emitting element connected to the first pixel circuit. In the first pixel circuit, the first transistor has a gate connected to the gate signal line, and one of a source and a drain connected to the data signal line; and the second transistor has a source and a drain of which one is connected to the power source line and the other is connected to the light emitting element. A test element group has a second pixel circuit which is the same as the first pixel circuit. In the second pixel circuit, at least one of the first transistor and the second transistor is electrically connected to the terminal; and a gate signal line is electrically connected to the gate signal line of the first pixel circuit through a switch.

Another mode of the invention is a semiconductor device including a substrate defining a vapor deposition region having a film formed by a vapor deposition method and a pixel region provided in the vapor deposition region; a pixel provided in the pixel region; a test element group for testing an element in the pixel region, which is provided in the vapor deposition region outside of the pixel region; and at least one terminal which is provided outside of the vapor deposition region and electrically connected to the test element group. The pixel includes a first pixel circuit having a first transistor, a second transistor, a gate signal line, a data signal line, and a power source line; and a light emitting element connected to the first pixel circuit. In the first pixel circuit, the first transistor has a gate connected to the gate signal line, and a source and a drain of which one is connected to the data signal line and the other is connected to a gate of the second transistor; and the second transistor has a source and a drain of which one is connected to the power source line and the other is connected to the light emitting element. The test element group has a second pixel circuit which is the same as the first pixel circuit. In the second pixel circuit, at least one of the first transistor and the second transistor is electrically connected to the terminal; and a certain potential of a gate signal line of the second pixel circuit is maintained.

In the invention, a second pixel circuit of the test element group is the same as the first pixel circuit in a pixel region. This means that the invention includes a circuit to which a change is added in order to electrically connect an element in the pixel circuit of the test element group to a terminal. Further, a plurality of the second pixel circuits can be provided in matrix in the test element group.

In the invention, when a transistor provided in a pixel region is tested, the transitsor is provided in the test element group. Meanwhile, when a capacitor provided in a pixel region is tested, the capacitor is provided in the test element group.

Further, a semiconductor device of the invention includes another substrate, which is fixed by a sealing material so as to face the substrate to seal the vapor deposition region. The terminal is provided outside of a region sealed by the another substrate and the sealing material.

As for a transitsor applicable to the invention, a material of a semiconductor in a channel formation region is not limited. For example, the following semiconductors are given: a non-single crystalline semiconductor film typified by amorphous silicon and polycrystalline silicon; a monocrystalline semiconductor film which is formed using a semiconductor substrate or an SOI substrate; an organic semiconductor; and a carbon nanotube. Further, a substrate over which a pixel region and a test element group are provided and a substrate used for sealing are not limited to a particular type. For example, a glass substrate or a plastic substrate can be used.

In the invention, the test element group (TEG) is provided in the vapor deposition region, whereby electrical characteristics of an element in the pixel region can be measured quantitively before or after vapor deposition from a measurement result of the TEG. For example, the vapor deposition process is conducted using the measurement result, whereby a semiconductor device to be a defective can be guessed before the vapor deposition. By thus measuring the TEG before the vapor deposition, a substrate which may be a defective does not need to be subjected to processes after the vapor deposition process. Therefore, unnecessary vapor deposition can be avoided and cost reduction can be achieved.

In the invention, the electrical characteristics of the TEG can be measured even after the vapor deposition region is sealed. Therefore, variation in the electrical characteristics of the TFT at high temperature or at low temperature can be measured quantitatively after sealing from a measurement result of the TEG. Thus, variation in electrical characteristics of the element in the pixel region due to temperature can be managed.

DETAILED DESCRIPTION OF THE INVENTION

Although the invention will be fully described by way of embodiment modes and an embodiment with reference to the accompanying drawings, it is to be understood that various changes and modifications will be apparent to those skilled in the art. Therefore, unless such changes and modifications depart from the spirit and the scope of the invention, they should be construed as being included therein.

Further, in this specification, a source and a drain of the TFT are names adopted for convenience to distinguish electrodes except a gate in a structure of the TFT. In the invention, in a case of a structure where a polartity of the TFT is not limited, names of a source and a drain changes when the polarity is considered. Therefore, a source or a drain may be described as one of one electrode and the other electrode.

Embodiment Mode 1

Figure 1:
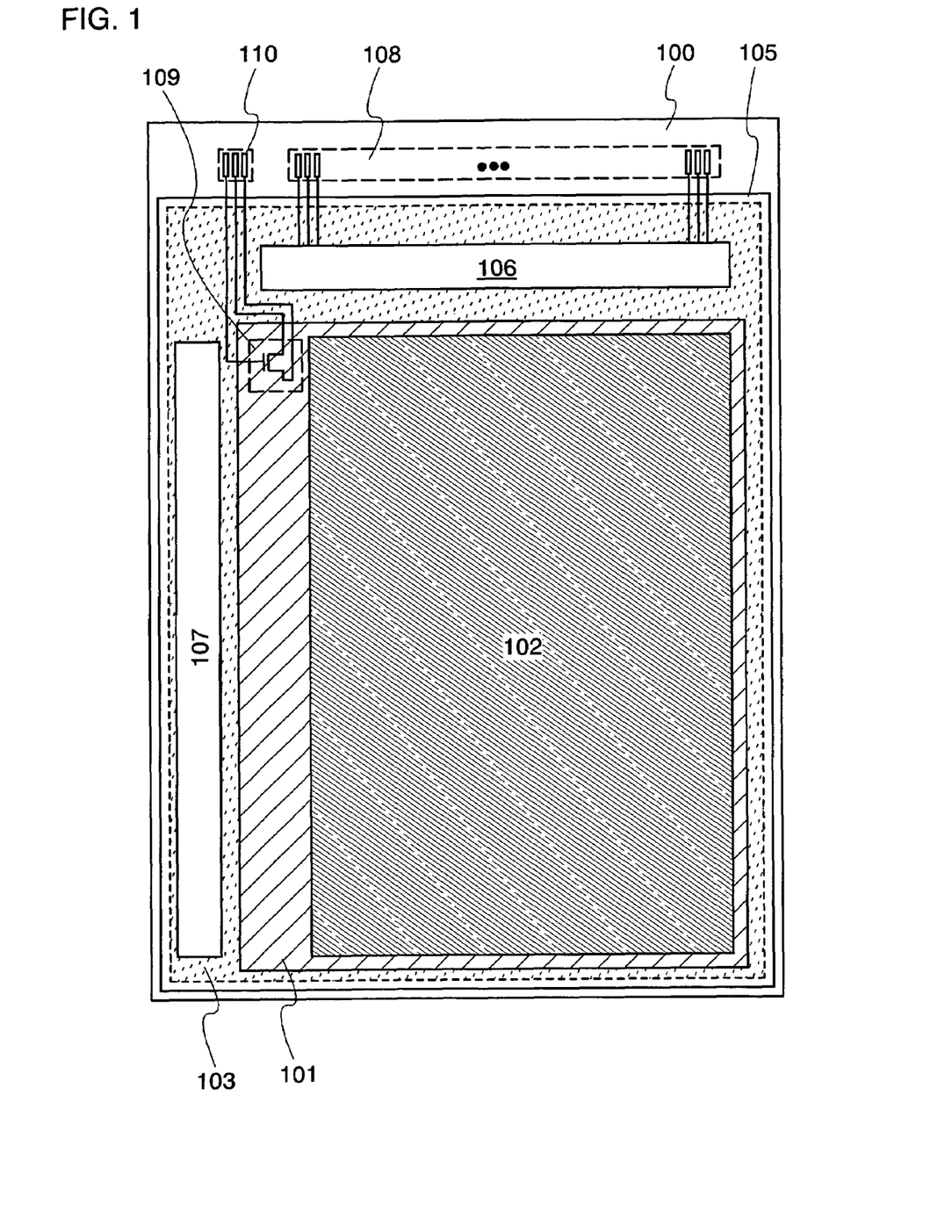
FIG. 1 is a view showing an EL panel of Embodiment Mode 1.

In this embodiment mode, an example of applying a semiconductor device to an active EL panel is described. FIG. 1 shows a front view of an EL panel of this embodiment mode.

A substrate 100 includes a vapor deposition region 101, a pixel region 102 provided inside of the vapor deposition region 101, and a sealing region 103 surrounding the vapor deposition region 101. In the pixel region 102, a plurality of light emitting elements and pixels provided with a pixel circuit electrically connected to the light emitting element are provided in matrix. The pixel circuit is formed of a transistor, a capacitor, and the like, and a specific example thereof is described in Embodiment Mode 2.

In the vapor deposition region 101 including the pixel region 102, a flim is formed by a vapor deposition method when a light emitting element of a pixel is formed. The sealing region 103 is provided with a sealing material. A substrate 105 for sealing is fixed to the subsrate 100 by the sealing material, and it is airtight between the substrates 100 and 105. In other words, the vapor deposition region 101 is sealed by the substrate 105 and the sealing material.

In the substrate 100, the sealing region 103 is provided with a data signal line driver circuit 106 and a gate signal line driver circuit 107. Transistors in the pixel region 102, the data signal line driver circuit 106, and the gate signal line driver circuit 107 are formed of TFTs. Although the data signal line driver circuit 106 and the gate signal line driver circuit 107 are provided over the substrate 100 with the pixel region 102, they may be provided a substrate other than the substrate 100.

A terminal portion 108 in which a plurality of terminals for externally inputting a signal and a power source to the data signal line driver circuit 106, the gate signal line driver ciurcit 107, a pixel circuit, and the like are arranged is provided for one side of the substrate 100. The termial portion 108 is provided outside of the sealing region 103 so as not to be covered with the substrate 105. In FIG. 1, only a terminal of the terminal portion 108, which is connected to the data signal line driver circuit 106, is shown.

In the substrate 100, the vapor deposition region 101 except the pixel region 102 is provided with a TEG 109 for inspecting an element such as a transistor or a capacitor in the pixel region 102. The TEG 109 is conncted to a measurement terminal provided in a measurement terminal portion 110. The measurement terminal poriton 110 is provided outside of the sealing poriton 103 similarly to the terminal portion 108. Thus, TEG 109 can be measured even after being formed to be a module or a product. The measurement terminal poriton 110 is provided so as not to be covered by the substrate 105, so that the TEG 109 can easily be measured.

The TEG 109 is formed simultaneously in the same process as a TFT formed in the pixel region 102, the data signal line driver circuit 106, and the gate signal line driver circuit 107. After the TEG 109 and a TFT in the pixel region 102 and the like are formed, a light emitting element is formed in the pixel region 102. When the light emitting element is formed, an EL layer and the like are formed in the vapor deposition region 101 by a vapor deposition method. Therefore, the TEG 109 is also affected together with a TFT formed in the pixel region 102 by the vapor deposition process. Thus, electrical characteristics of the TFT 109 are measured before or after the vapor deposition process, thereby monitoring an effect to the TFT formed in the pixel region 102 due to the vapor deposition process.

A structure of the TEG 109 is described with reference to FIGS. 2A to 2F. Note that reference numerals in FIGS. 3A to 3D are the same as those in FIGS. 2A to 2F. FIGS. 2A to 2F show an example in which a transistor is formed as the TEG 109. The TEG 109 in FIGS. 2A to 2D is referred to as a transistor TEG for convenience.

Figure 2A:
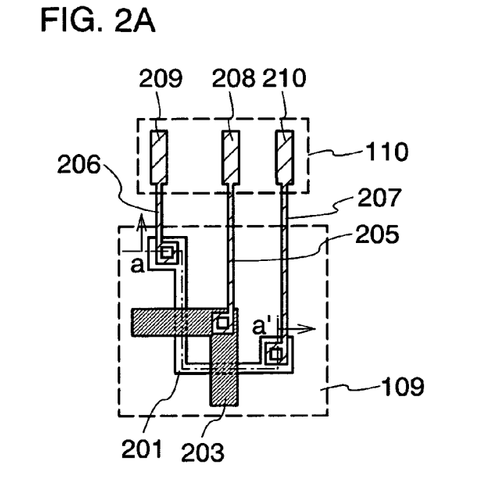
FIGS. 2A to 2D are plan views showing layouts of a TEG of Embodiment Mode 1 and FIGS. 2E and 2F are cross sectional views thereof.
Figure 2B:
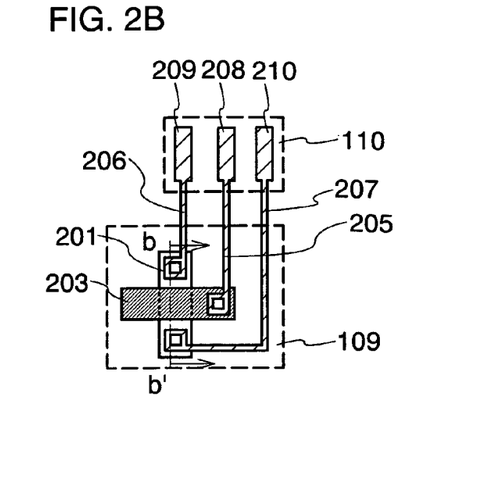
Figure 2C:
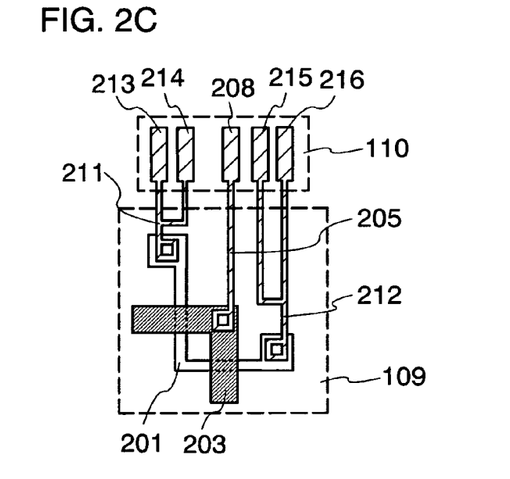
Figure 2D:
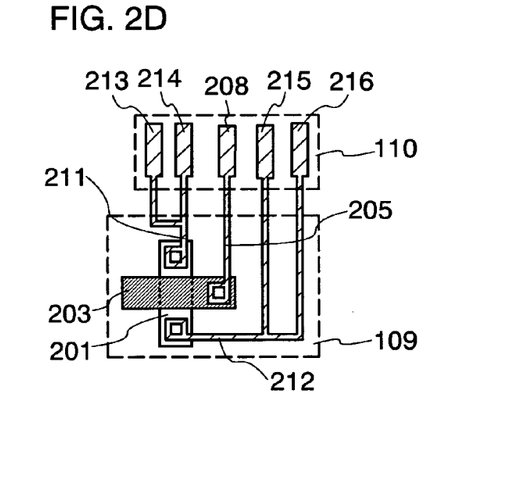
Figure 2E:
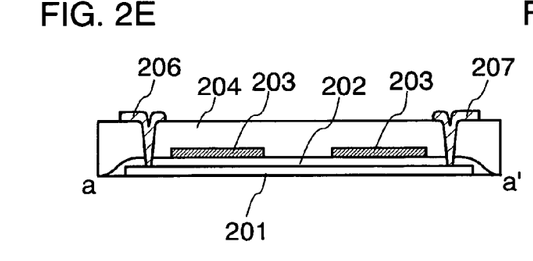
Figure 2F:
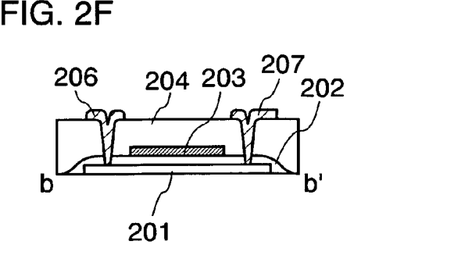

FIGS. 2A and 2B are top plan views of the transitsor TEG 109. FIG. 2E is a cross sectional view taken along a line A-A' in FIG. 2A. FIG. 2F is a cross sectional view taken along a line B-B' in FIG. 2B. In addition, FIGS. 3A to 3D show equivalent circuits of FIGS. 2A to 2D, respectively.

Figure 3A:
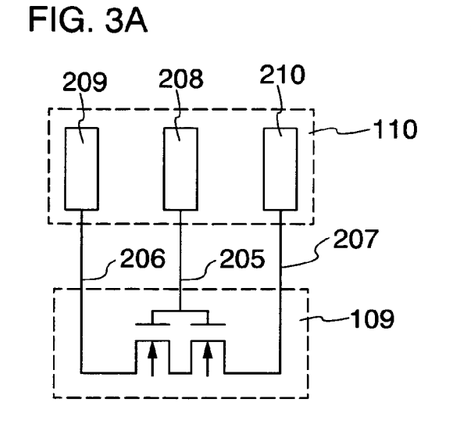
FIGS. 3A to 3D are equivalent circuit diagrams of FIGS. 2A to 2F.
Figure 3B:
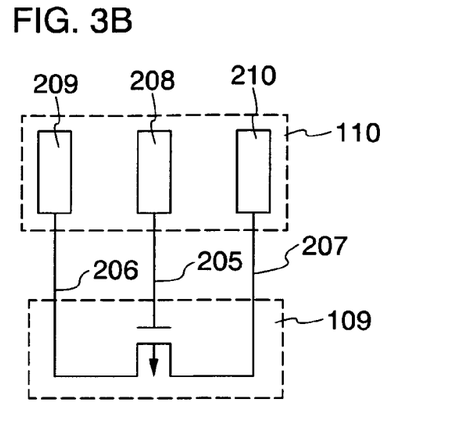

The transistor TEG 109 in FIGS. 2A and 2B is a TFT having a top gate structure where a gate insulating film 202 and a gate electrode 203 are stacked over a semiconductor layer 201. The semiconductor layer 201 is provided with a channel formation region, a source region, and a drain region. The TEG 109 in FIG. 2A is an n-channel TFT where a quinquevalent impurity such as phosphorus is injected into the source region and the drain region, and also a TFT which has a multigate structure (also referred to as a multichannel structure) including a plurality of channel formation regions (FIG. 3A). On the other hand, the TEG 109 in FIG. 2B is a p-channel TFT where a trivalent impurity such as boron is injected into the source region and the drain region, and also a TFT which has a single-gate structure including one channel formation region (FIG. 3B).

Three terminals of the transistor TEG 109 are electrically connected to wirings 205, 206, and 207, respectively. The gate electrode 203 which is a first termial is connected to the wiring 205 through a contact hole formed in the insulating layer 204. One of a second terminal and a third terminal corresponds to a source, and the other corresponds to a drain. The second terminal and the third terminal are electrically connected to the wiring 206 and the wiring 207 through contact holes formed in the insulating layer 204 and the gate insulatin layer 202 respectively. The wirings 205, 206, and 207 are led in the vapor deposition region 101 and pulled to outside of the sealing region 103 to be electrically connected to measurement terminals 208, 209, and 210 of the measurement terminal portion 110. Here, an example where the same conductive film is patterned to form the wirings 205, 206, and 207, and the measurement terminals 208, 209, and 210 is shown; however, each of them may be formed from a different conductive film.

Although FIGS. 2A and 2B show an example in which one measurement terminal is connected to one terminal of the TEG 109, a plurality of measurement terminals may be connected to one terminal of the TEG 109. One mode is shown in FIGS. 2C and 2D. FIGS. 2C and 2D are transforms of FIGS. 2A and 2B, respectively. Wirings 211 and 212 each diverging in two directions are used instead of the wirings 206 and 207. The second terminal is electrically connected to measurement terminals 213 and 214 through the wiring 211. The third terminal is electrically connected to the measurement terminals 215 and 216 through the wiring 212.

The wirings 211 and 212 are each diverged in two directions to be divided into a passage for measuring current characteristics and a passage for measuring voltage characteristics, and the transistor TEG 109 is connected to the measurement terminal portion 110. Therefore, wiring resistance can be ignored, and electrical characteristics of the transitsor TEG 109 can be measured more accurately.

A structure of the transistor TEG 109 is not limited to that shown in FIGS. 2A to 2F. Conductivity, a structure of the gate electrode (a single gate structure or a multigate structure), a structure of the TFT (a bottom gate structure, a top gate structure, or a dual gate structure in which gate electrodes are over and under the channel formation region), presence of an LDD region, and the like of the transitsor TEG 109 may be appropriately selected. In order to conduct a test more accurately, the transitsor TEG 109 preferably has the same structure and the same size as a TFT formed in the pixel region 102.

The transitsor TEG 109 may have such a structure that a damage is intentionally given thereto by the vapor deposition process. For example, there are a method by which a wiring led over the transistor TEG 109 is removed, and the like.

Figure 4A:
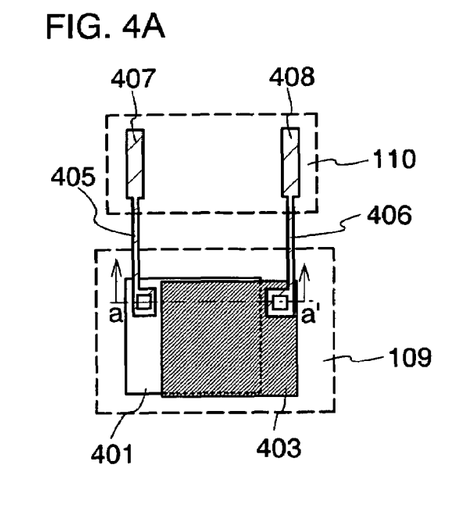
FIG. 4A is a top plan view showing a layout of Embodiment Mode 1.
Figure 4B:
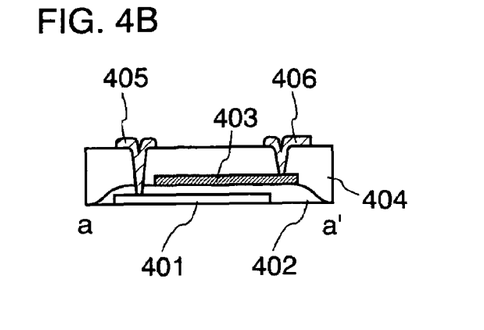
FIG. 4B is a cross sectional view thereof.
Figure 4C:
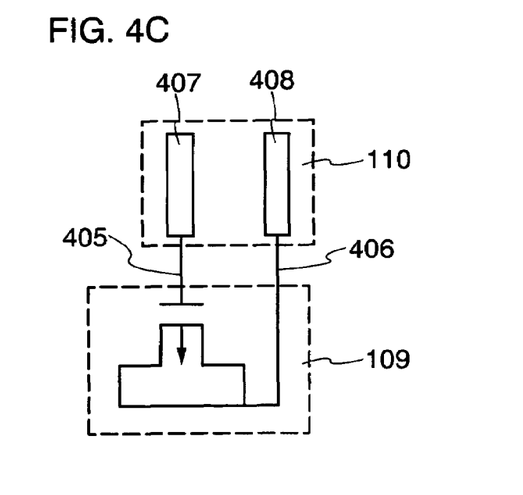
FIG. 4C is an equivalent circuit diagram thereof.

Another mode of the TEG 109 is described with reference to FIGS. 4A to 4C. FIGS. 4A to 4C show an example in which a capacitor is formed as the TEG 109. For convenience, the TEG 109 in FIGS. 4A to 4C is referred to as a capacitor TEG 109. FIG. 4A shows a top plan view of the capacitor TEG 109. FIG. 4B is a cross sectional view taken along a line A-A' in FIG. 4A. FIG. 4C shows an equivalent circuit of FIG. 4A. In FIGS. 4A to 4C, the same elements are denoted by the common reference numerals.

The capacitor TEG 109 has a structure in which a gate insulating film 402 and a gate electrode 403 are stacked over a semiconductor layer 401. Further, the capacitor TEG 109 is formed at the same time as the TFT in the pixel region 102. The semiconductor layer 401, the gate insulating film 402, and the gate electrode 403 are formed when the semiconductor layer, the gate insulating film, and the gate electrode of the TFT in the pixel region 102 are formed, respectively. In order to conduct a test more accurately, the capacitor TEG 109 preferably has the same structure and the same size as a capacitor formed in the pixel region 102.

In a region of the semiconductor layer 401, which is not covered with the gate electrode 403, a trivalent impurity such as boron is added to form an impurity region having P-type conductivity. Needless to say, a quinquevalent impurity may be added to form an N-type impurity region. A P-type impurity region of the semiconductor layer 401 functions as one electrode (first terminal) of the capacitor, and the gate electrode 403 functions as the other electrode (second terminal).

The gate electrode 403 is connected to a wiring 406 through a contact hole formed in the insulating layer 404. The P-type impurity region of the semiconductor layer 401 is electrically connected to a wiring 405 through contact holes formed in the insulating layer 404 and the gate insulating layer 402. The wirings 405 and 406 are led to outside of the vapor deposition region 101 to be electrically connected to measurement terminals 408 and 409 of the measurement terminal portion 110. Here, an example where the same conductive film is patterned to form the wiring 405 and a measurement terminal 407, and the wiring 406 and the measurement terminal 408 respectively; however, each of them may be formed from a different conductive film.

Another mode of the capacitor TEG is described. In order to measure parasitic capacitance of the wirings 405 and 406 which are led outside of the sealing region 103 from the capacitor TEG 109 in FIG. 4A, the same wirings as the wirings 405 and 406 are additionally formed over the substrate 100 and connected to a terminal of the measurement terminal portion 110. Then, parasitic capacitance of the additionally formed wiring is measured and subtracted from a capacitance value measured by the capacitor TEG 109. From this value, the value of charge storage capacitance of the capacitor in the pixel region 102 can be obtained more accurately.

Embodiment Mode 2

In an active matrix EL panel, pixels are arranged in matrix. A pixel circuit of an active matrix EL panel is described with reference to FIG. 5. The pixel circuit is formed of a data signal line 501, a gate signal line 502, a power source line 503, a TFT 504, a TFT 505, and a charge storage capacitor 506.

Figure 5:
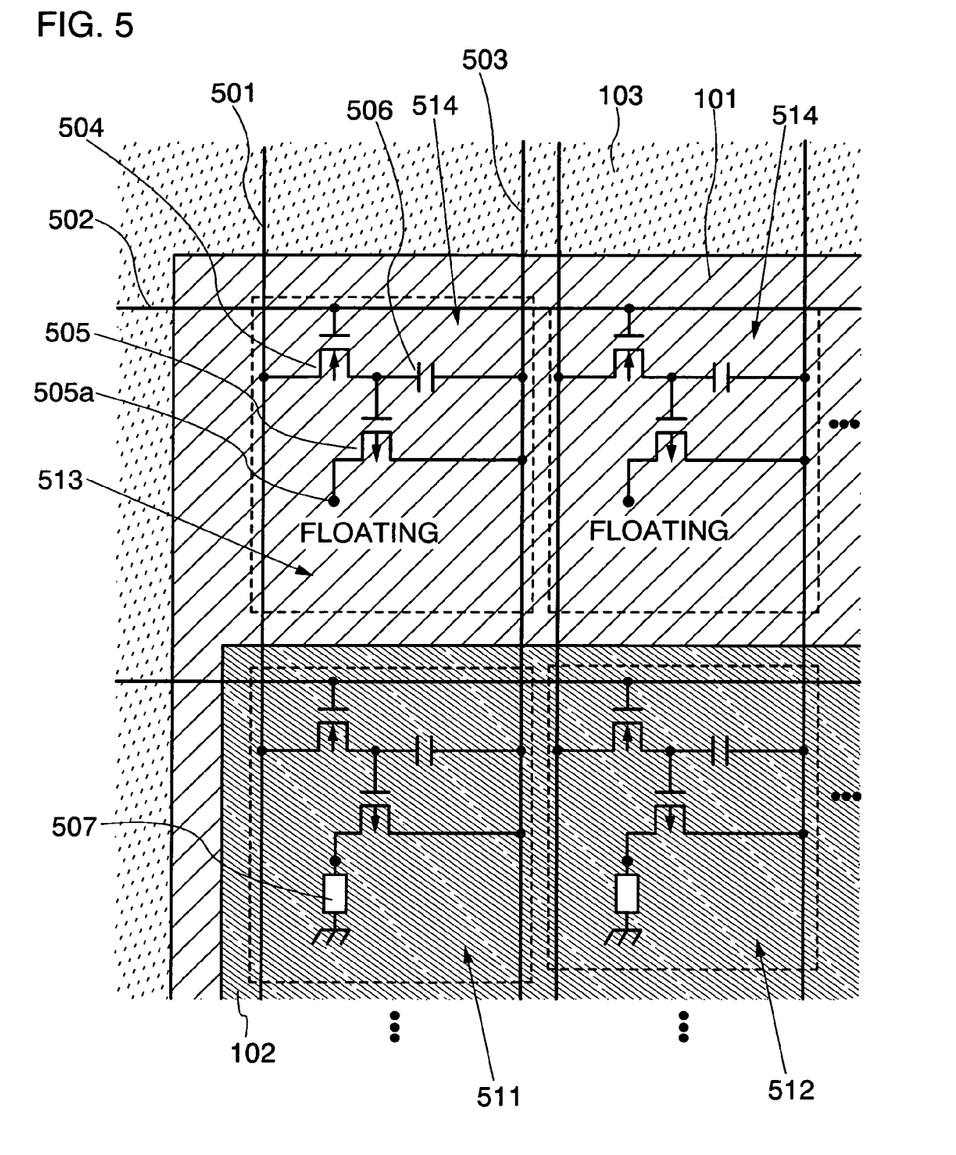
FIG. 5 is an equivalent circuit diagram of a pixel circuit including a dummy pixel.

The data signal line 501 is connected to the data signal line driver circuit 106. The gate signal line 502 is connected to the gate signal line driver circuit 107. The power source line 503 is connected to a power source.

The TFT 504 has a gate connected to the gate signal line 502, and a source and a drain of which one is connected to the data signal line 501 and the other is connected to a gate of the TFT 505 and one electrode of the capacitor 506. One of a source and a drain of the TFT 505, and the other electrode of the capacitor 506 are connected to the power source line 503. In some cases, the TFT 504 and the TFT 505 are referred to as a select TFT and a driving TFT, respectively.

An electrode 505a (corresponding to a source or a drain) of the TFT 505 of a pixel 511 and a pixel 512 which are provided in the pixel region 102 is connected to a light emitting element 507 typified by an organic EL element and an inorganic EL element. On the other hand, the electrode 505a of the TFl 505 of a pixel 513 and a pixel 514 which are provided in the pixel region 101 outside of the pixel region 102 is not connected to the light emitting element 507. Thus, a potential of the electrode 505a of the TFT 505 is not fixed and is in a floating state.

In this specification, pixels which do not function substantially such as the pixels 513 and 514 are referred to as dummy pixels for convenience. As shown in FIG. 5, a dummy pixel may be provided in the pixel region 102 of the active matrix EL panel. In this embodiment mode, such a dummy pixel is used for a TEG for inspecting a pixel formed in the pixel region 102.

Figure 6:
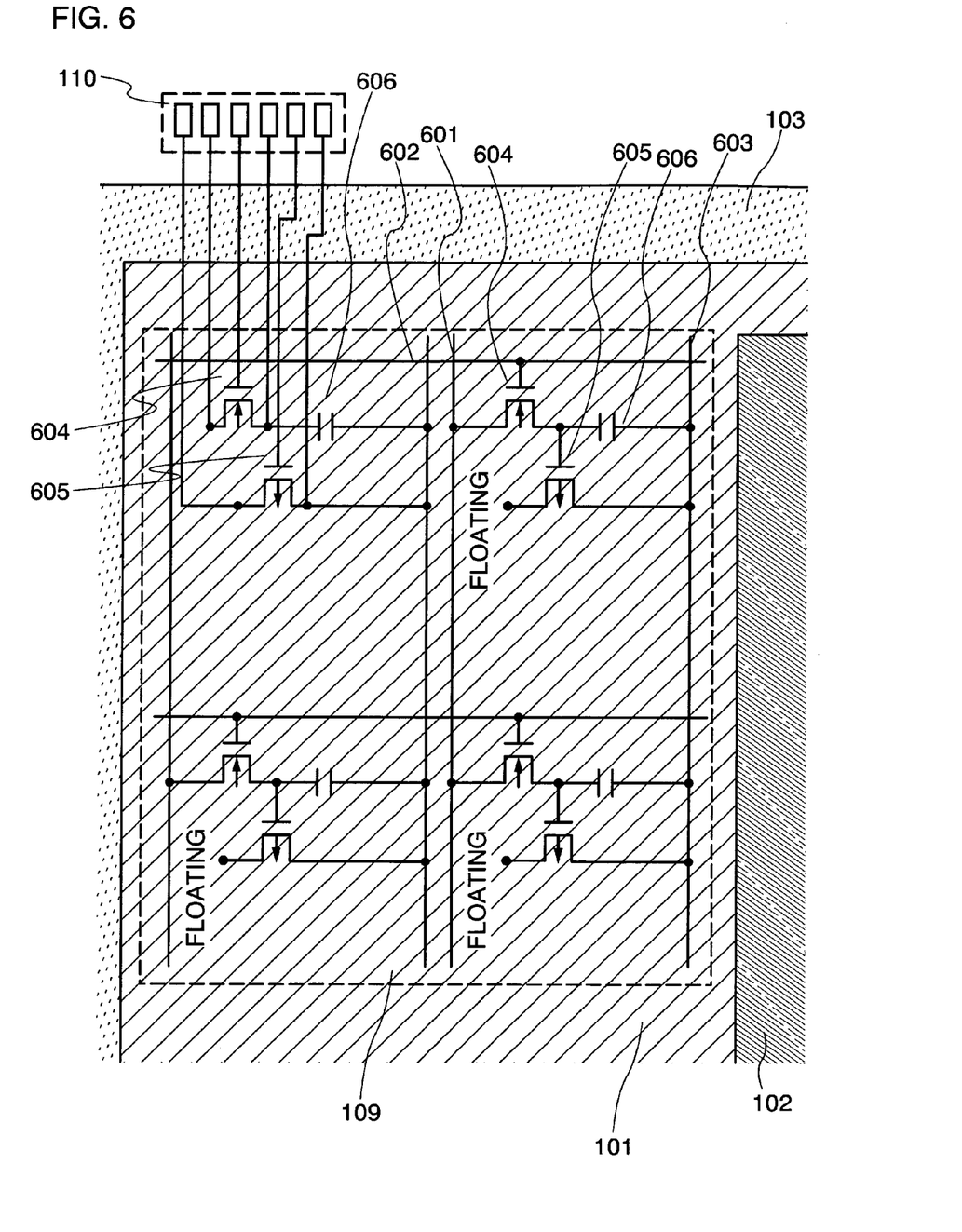
FIG. 6 is a view showing an EL panel of Embodiment Mode 2.

The TEG of this embodiment mode is described with reference to FIG. 6. As shown in FIG. 6, the TEG 109 including dummy pixels of n rows and m columns (two rows and two columns in FIG. 6) is provided in the vapor deposition region 101 outside of the pixel region 102. A pixel circuit of the dummy pixel includes a data signal line 601, a gate signal line 602 intersecting with the data signal line 602, a power source line 603, a TFT 604, a TFT 605, and a capacitor 606.

In the pixel circuit, the TFT 604 has a gate connected to the gate signal line 602, and a source and a drain of which one is connected to the data signal line 601 and the other is connected to a gate electrode of the TFT 605 and one electrode of the capacitor 606. One of a source and a drain of the TFT 605 is connected to the power source line 603, and the other has a potential which is not fixed and in a floating state. Further, one electrode of the capacitor 606 is connected to one of the source and the drain of the TFT 604, and the other electrode of the capacitor 606 is connected to the power source line 603. It is needless to say that the pixel circuit provided in the pixel region 102 is the same circuit as that of the dummy pixel shown in FIG. 6, and the electrode of the TFT 605 in a floating state is connected to a light emitting element.

Further, in the dummy pixel of the TEG 109, the data signal line 601, the gate signal line 602, and the power source line 603 are dummy wirings which are provided virtually, and a signal or a potential is not supplied thereto from outside. In other words, the wirings 601, 602, and 603 are not connected to a wiring, an electrode, a terminal, and the like which are outside of the TEG 109.

In this embodiment mode, the TFT 604 and the TFT 605 of one of dummy pixels (a dummy pixel of the first row and the first column in the figure) of the TEG 109 are connected to the measurement terminal provided in the measurement terminal portion 110. The gate, the source, and the drain of the TFTs 604 and 605 are connected to a different measurement terminal of the measurement terminal portion 110 through a wiring led to the measurement terminal portion 110 provided outside of the sealing region 103, respectively.

Note that in the dummy pixel connected to the measurement terminal, terminals of the TFT 604, which are connected to the data signal line 601 and the gate signal line 602, are connected to only the measurement terminal. A terminal of the TFT 605, which is connected to the TFT 604, is connected to only the measurement terminal.

Figure 3C:
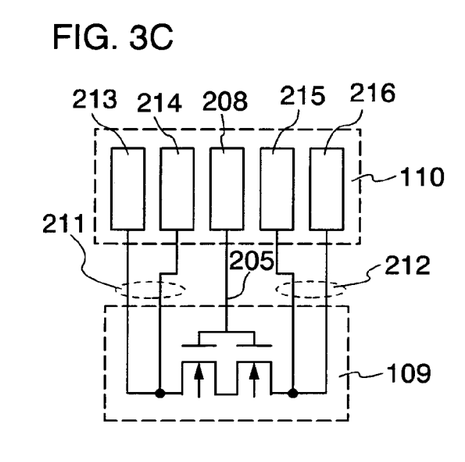
Figure 3D:
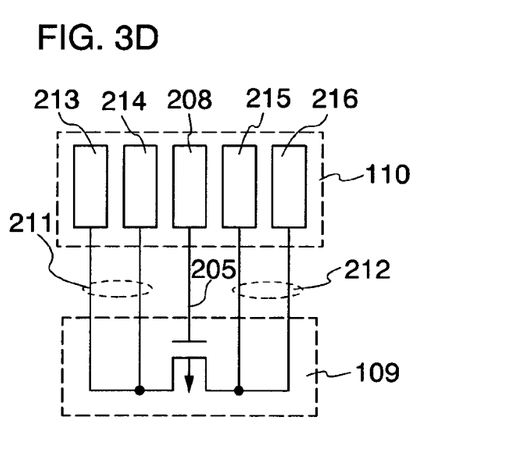

Further, electrical characteristics can be measured ignoring wiring resistance by connecting the TFTs 604 and 605 to the measurement terminal portion 110 as shown in FIGS. 3C and 3D, which is preferable.

Although the TFTs 604 and 605 of the TEG 109 are measured in FIG. 6, the capacitor 606 may be measured as described in Embodiment Mode 1. In addition, a position of the dummy pixel to be measured is not limited to the first row and the first column. Further, increasing the number of terminals in the measurement terminal portion 110 makes it possible to measure elements of a plurality of dummy pixels.

In this embodiment mode, an element in a circuit equivalent to the pixel circuit in the pixel region 102 can be measured by using the dummy pixel for the TEG 109. Therefore, electrical characteristics of a transistor in the pixel region 102 can be measured more accurately by using the TEG of this embodiment mode as compared to a TEG formed of one transistor.

Pixel circuits of a pixel and a dummy pixel of this embodiment mode are one example, and is not limited to FIG. 6. There may be two or more TFTs or a plurality of gate signal lines. The pixel circuit includes at least a data signal line, a gate signal line, a power source line, a select TFT, and a driving TFT, as shown in FIGS. 5 and 6. A charge storage capacitor may be provided as needed. This is the same for Embodiment Modes 3 to 5 described below.

Embodiment Mode 3

In this embodiment mode, description is made of an example of an active matrix EL panel in which a dummy pixel is used for a TEG, as in Embodiment Mode 2. This embodiment mode is described with reference to FIG. 7.

Figure 7:
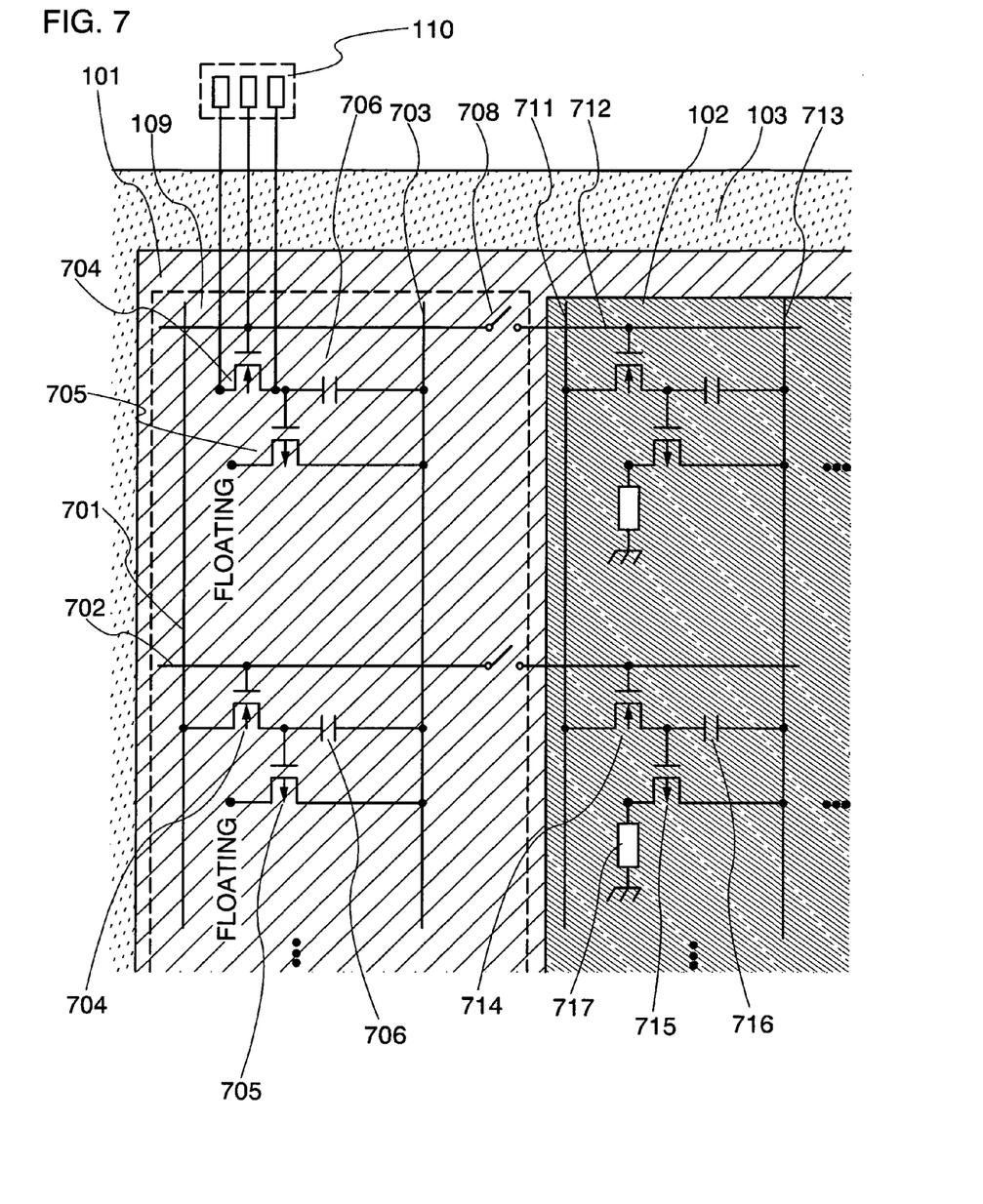
FIG. 7 is a view showing an EL panel of Embodiment Mode 3.

A pixel circuit in the pixel region 102 is provided with a data signal line 711, a gate signal line 712 intersecting with the data signal line 711, a power source line 713 along the data signal line 711, a TFT 714, a TFT 715, and a capacitor 716. A light emitting element 717 is connected to the TFT 715 of the pixel circuit.

The TFT 714 has a gate connected to the gate signal line 712, and a source and a drain of which one is connected to the data signal line 711 and the other is connected to a gate electrode of the TFT 715 and one electrode of the capacitor 716. One of a source and a drain of the TFT 715 is connected to the power source line 713, and the other is connected the light emitting element 717. One electrode of the capacitor 716 is connected to one of the source and the drain of the TFT 714, and the other electrode of the capacitor 716 is connected to the power source line 713.

The TEG 109 is provided with dummy pixels of n rows and m columns, each including the same pixel circuit as a pixel provided in the pixel region 102. In this embodiment mode, the number of rows of pixels is the same as in the pixel region 102 and the number of columns is one. Note that the number of rows and columns of the dummy pixels used for the TEG 109 is allowed as long as it is one or more and the number of rows and columns of the pixel region or less.

Each dummy pixel has a pixel circuit including a data signal line 701, a gate signal line 702 intersecting with the data signal line 701, a power source line 703 along the data signal line 701, a TFT 704, a TFT 705, and a capacitor 706.

The TFT 704 has a gate connected to the gate signal line 702, and a source and a drain of which one is connected to the data signal line 701 and the other is connected to a gate electrode of the TFT 705 and one electrode of the capacitor 706. One of a source and a drain of the TFT 705 is connected to the power source line 703, and the other has a potential which is not fixed and in a floating state. One electrode of the capacitor 706 is connected to one of the source and the drain of the TFT 704, and the other electrode of the capacitor 706 is connected to the power source line 703.

In this embodiment mode, the TFT 704 of one of dummy pixels (a dummy pixel of the first row and the first column in the figure) is connected to the measurement terminal portion 110 for the purpose of measuring electrical characteristics of the TEG 109. The gate, the source, and the drain of the TFT 704 are connected to a different measurement terminal of the measurement terminal portion 110 through a wiring led to the measurement terminal portion 110 which is provided outside of the sealing region 103, respectively. The TFT 704 is not connected to the data signal line 701 but connected to only the measurement terminal.

Further, as shown in FIGS. 3C and 3D, it is also preferable that the TFT 704 be connected to the measurement terminal portion 110 since electrical characteristics can be measured ignoring wiring resistance.

The gate signal line 702 of each row of the TEG 109 is electrically connected to the gate signal line 712 in the pixel region 102 through a switch 708. A structure of the switch 708 is not limited as long as it can switch between a conductive state and a nonconductive state. For example, an analog switch can be provided as the switch 708. On the other hand, the data signal line 701 and the power source line 703 are wirings to which a signal or a potential is not externally supplied, and which are not connected to a wiring, an electrode, a terminal, or the like outside of the TEG 109.

In this embodiment mode, the switch 708 is interposed between the pixel region 102 and the gate signal line 702 of the dummy pixel so that it can appropriately switch to electrically connect/disconnect the gate signal line 712 in the pixel region 102 and the gate signal line 702 of the TEG 109 in accordance with whether electrical characteristics of the TEG 109 are measured or not.

In the case of measuring the electrical characteristics of the TEG 109, the gate signal line 702 of a row including an element connected to the measurement terminal portion 110 among the gate signal lines 702 of the TEG 109 is electically connected to the gate signal line 712 in the pixel region 102 of a corresponding row by the switch 708, and the gate signal lines 702 of the other rows are electrically disconnected to the gate signal lines 712 by the switch 708. Further, the electrical characteristics of the element of the TEG 109 can be measured more similarly to the pixel circuit in the pixel region 102 than when the gate signal line 702 is not connected to the gate signal line 712. The pixel circuit in the pixel region 102 is prevented from having a defect while the electrical characteristics of the TEG 109 are measured.

It is preferable that the gate signal line 702 of the TEG 109 be electrically disconnected to all of the gate signal lines 712 in the pixel region 102 when the electrical characteristics of the TEG 109 are not measured or when an EL panel is used. This is because one of the source and the drain of the TFT 705 is in a floating state. If the gate signal line 712 in the pixel region 102 and the gate signal line 702 of the TEG 109 are electrically connected to each other when the electrical characteristics of the TEG 109 are not measured, a display defect may be generated depending on a potential of the gate, the source, and the drain of the TFT 705.

Although electrical characteristics of only the TFT 704 are measured in the TEG 109 of this embodiment mode, the TFT 705 may be measured as described in Embodiment Mode 2. Further, the capacitor 706 may be measured as described in Embodiment Mode 1. In addition, although a TFT in the dummy pixel of the first row and the first column is measured, a position of the dummy pixel to be measured is not limited to the position. A plurality of dummy pixels may be measured. All the gate signal lines 702 are not necessarily provided with the switch 708. The gate signal line 702 of a row, which is provided with an element connected to the measurement terminal portion 110, and the gate signal line 712 of the corresponding row are appropriately switched to be electrically connected/disconnected by the switch 708, and the gate signal lines 702 of the other rows can also be electrically disconnected to an external wiring, electrode, terminal, or the like, similarly to the data signal lines 701.

Embodiment Mode 4

In this embodiment mode, description is made of an example of an active matrix EL panel in which a dummy pixel is used for a TEG; as in Embodiment Mode 2. This embodiment mode is described with reference to FIG. 8.

Figure 8:
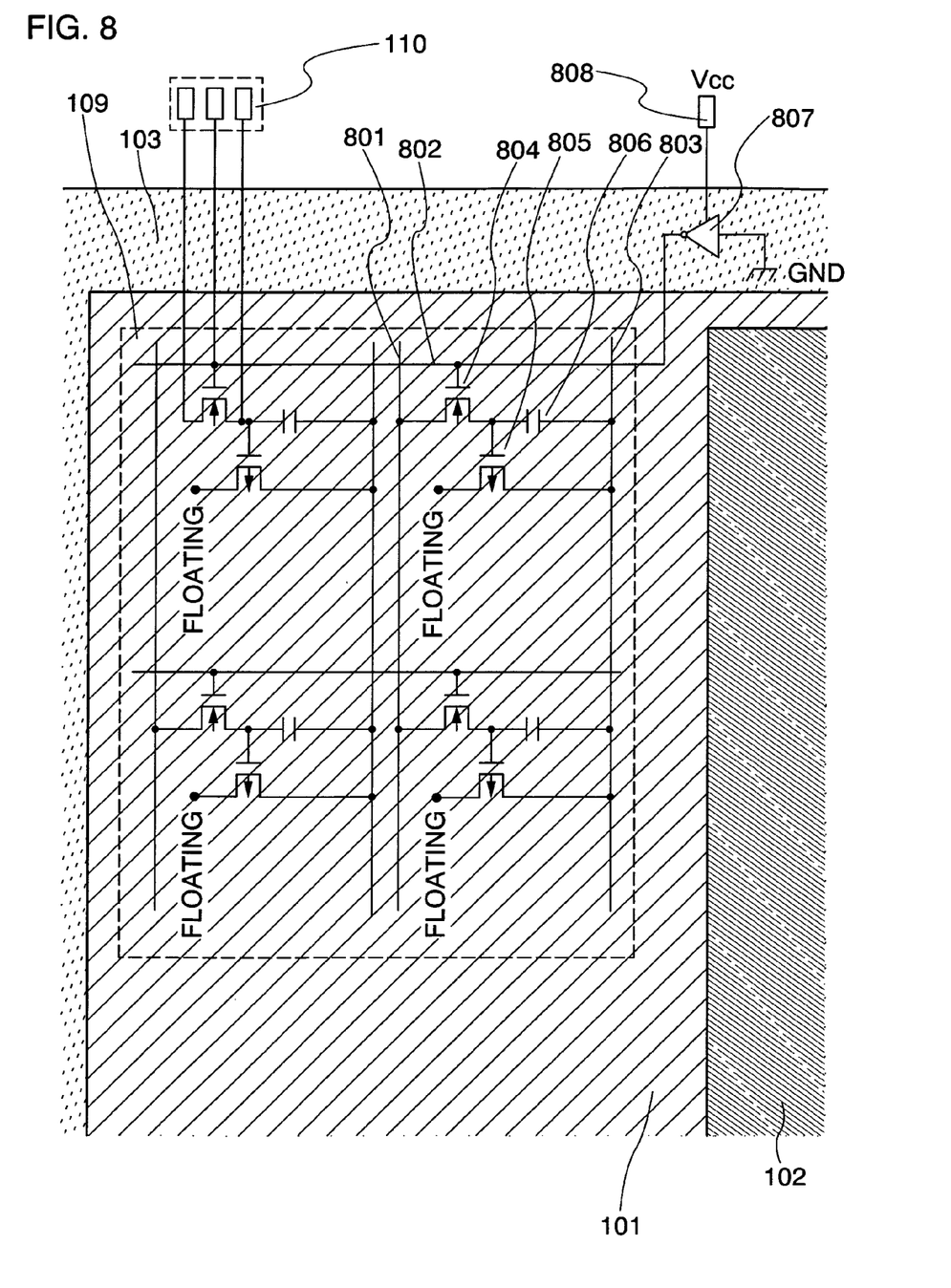
FIG. 8 is a view showing an EL panel of Embodiment Mode 4.

As shown in FIG. 8, the TEG 109 is provided in the vapor deposition region 101 outside of the pixel region 102. In this embodiment mode, dummy pixels of n rows and m columns (here, two rows and two columns) are provided as the TEG 109. Note that the number of rows and columns of the dummy pixels used for the TEG 109 is allowed as long as it is one or more and the number of rows and columns of the pixel region or less.

A pixel circuit of a pixel and a dummy pixel of this embodiment mode has the same structure as that of Embodiment Mode 2. The dummy pixel of the TEG 109 includes a data signal line 801, a gate signal line 802, a power source line 803, TFTs 804 and 805, and a capacitor 806.

In this embodiment mode, an output of a buffer 807 is connected to the gate signal line 802 of the first row of the TEG 109. An input of the buffer 807 is set to a ground potential (GND), and a positive potential Vcc is inputted from a terminal 808. The buffer 807 only needs to be provided outside of the vapor deposition region 101. In FIG. 8, the buffer 807 is provided in the sealing region 103 similarly to the driver circuits 106 and 107. The terminal 808 is provided in the terminal portion 108.

Further, the other wirings (the gate signal lines 802 of the second row and the subsequent rows, the data signal line 801, and the power source line 803) of the gate signal line 802 connected to the buffer 807 are not connected to a wiring, an electrode, a terminal, or the like outside of the TEG 109, and a signal or a potential is not externally supplied to the other wirings.

In this embodiment mode, the TFT 804 of a dummy pixel in a row, which is connected to the buffer 807 (a dummy pixel of the first row and the first column in FIG. 8) is connected to the measurement terminal portion 110. The gate, the source, and the drain of the TFT 804 are connected to a different measurement terminal of the measurement terminal portion 110 through a wiring led to the measurement terminal portion 110 which is provided outside of the sealing region 103, respectively. Note that in the dummy pixel connected to the measurement terminal portion 110, a terminal of the TFT 804, which is connected to the data signal line 801, is connected to only the measurement terminal.

Further, as shown in FIGS. 3C and 3D, it is also preferable that the TFT 804 be connected to the measurement terminal portion 110 since electrical characteristics can be measured ignoring wiring resistance.

The buffer 807 is provided, whereby a certain potential (positive potential Vcc) is always outputted from the buffer 807 to the gate signal line 802 of the first row in a dummy pixel. Electrical characteristics of the TFT 804 can be measured more similarly to the pixel circuit in the pixel region 102 than when a potential is not applied to the gate signal line 802. Therefore, the buffer 807 preferably has the same structure as that of a buffer in the last stage of the gate signal line driver circuit 107.

Although only the TFT 804 in the dummy pixel is measured in this embodiment mode, the invention is not limited to the TFT 804. The TFT 805 may be measured as described in Embodiment Mode 2, or the capacitor 806 may be measured as described in Embodiment Mode 1.

Embodiment Mode 5

Figure 9:
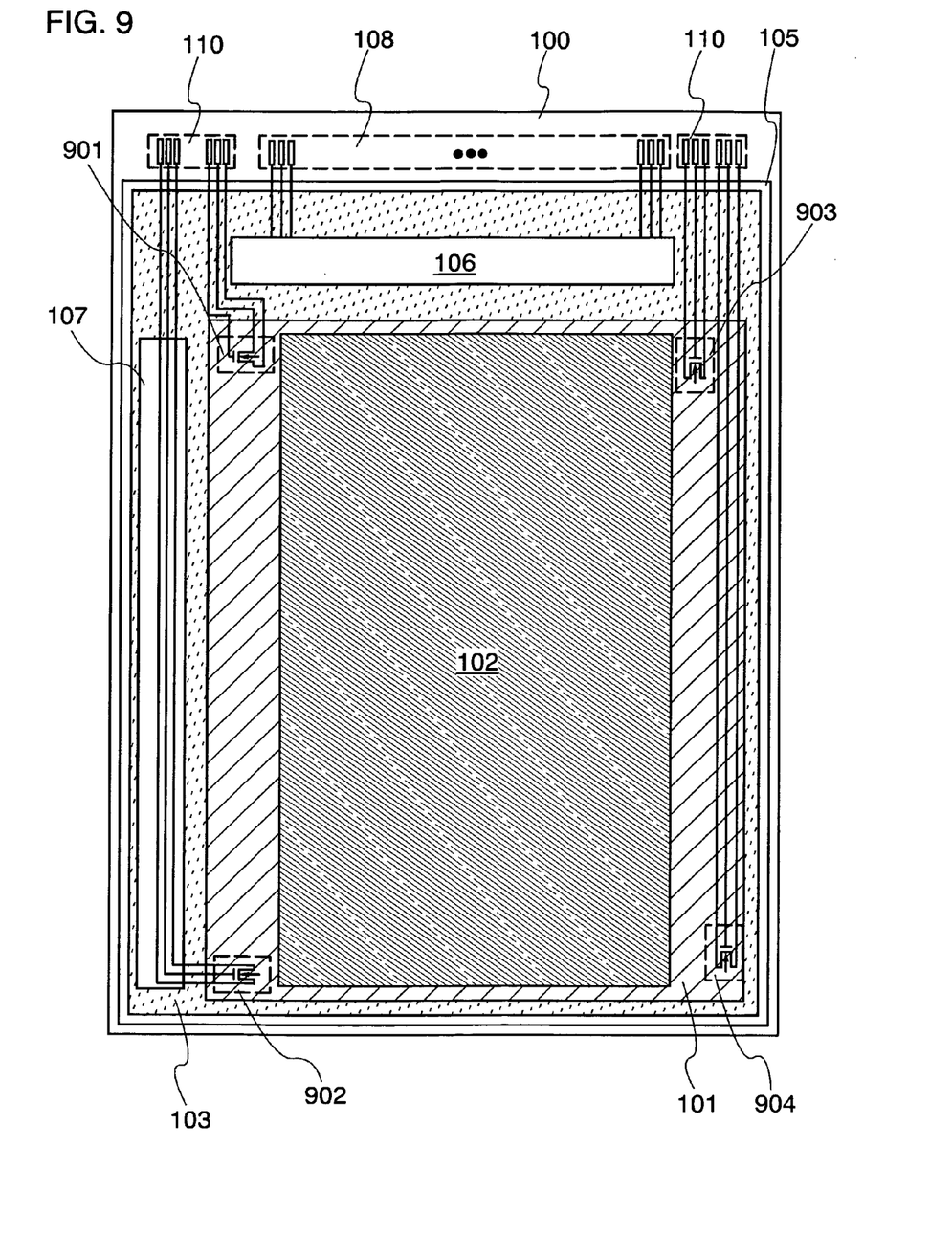
FIG. 9 is a view showing an EL panel of Embodiment Mode 5.

In this embodiment mode, the TEGs 109 are provided in a plurality of portions in the vapor deposition region 101, whereby electrical characteristics distribution of the TEG 109 can be measured in accordance with the position of the vapor deposition region 101.

As shown in FIG. 9, TEGs 901, 902, 903, and 904 are arranged in four corners of the vapor deposition region 101. The measurement terminal portions 110 are provided in two portions so that a wiring for connecting the TEGs 901, 902, 903, and 904 to the measurement terminal is made short. The wiring is led from electrodes of the TEGs 901, 902, 903, and 904 to the measurement terminal portion 110 provided outside of the sealing region 103, and connected to the measurement terminals. By measuring the electrical characteristics of the TEGs 901, 902, 903, and 904, electrical characteristics distribution of the element provided in the pixel region 102 depending on a position can be quantitatively measured.

In the case where a wiring for connecting the TEG 902 and the measurement terminal portion 110 overlaps the gate signal line driver circuit 107 as shown in FIG. 9, an insulating layer is required to be provided so that the wiring is not short-circuited with an electrode or a wiring of the gate signal line driver circuit 107. As this insulating layer, a common insulating layer to a partition wall for providing a light emitting element in the pixel region 102 may be used.

In Embodiment Modes 1 to 5, the leading distance of a wiring for connecting a TEG to the measurement terminal portion 110 is long in some cases, depending on a position where the TEG is provided. In those cases, wiring resistance might become significantly high, whereby electrical characteristics of the TEG cannot be accurately measured.

When a TFT in a TEG is measured, a source and a drain of the TFT provided in the TEG are connected to two measurement terminals respectively, as described in Embodiment Mode 1. Thus, electrical characteristics of the TFT can be measured ignoring wiring resistance (see FIGS. 3C and 3D). When a capacitor is measured, a wiring is additionally provided so that parasitic capacitance thereof can be measured as described in Embodiment Mode 1. Then, the parasitic capacitance is subtracted from capacitance of the capacitor, which is measured by the TEG, whereby the capacitance of the capacitor can be obtained accurately.

Although description is made of an example in which a light emitting element is not provided in a TEG in Embodiment Modes 1 to 5, a light emitting element may be provided. In the case of providing a light emitting element in a TEG, it is preferable to shield light so that light from the light emitting element in the TEG does not leak to outside of an EL panel.

Embodiment 1

An EL panel to which the invention is applied is preferably used for a display portion of an electronic appliance which drives with a battery, display portions of a display device and an electronic appliance with a large display screen, or the like. For example, a television device (television or television receiver), a camera such as a digital camera or a digital video camera, a mobile phone, a portable information terminal such as a PDA, a portable game machine, a monitor, a computer, an audio reproducing device such as a car audio system, an image reproducing device provided with a recording medium, such as a home game machine, and the like are given. Specific examples thereof are described with reference to FIGS. 10A to 10F.

Figure 10A:
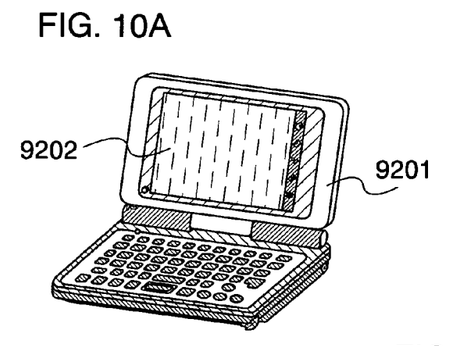
FIGS. 10A to 10F are views showing electronic appliances to which the invention is applied.

A portable information terminal shown in FIG. 10A includes a body 9201, a display portion 9202, and the like. A display device of the invention can be applied to the display portion 9202.

Figure 10B:
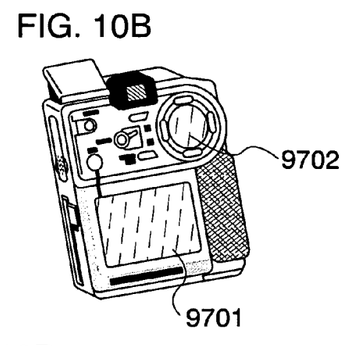

A digital video camera shown in FIG. 10B includes a display portion 9701, a display portion 9702, and the like. A display device of the invention can be applied to the display portion 9701.

Figures 10C, 10D, 10E, 10F:
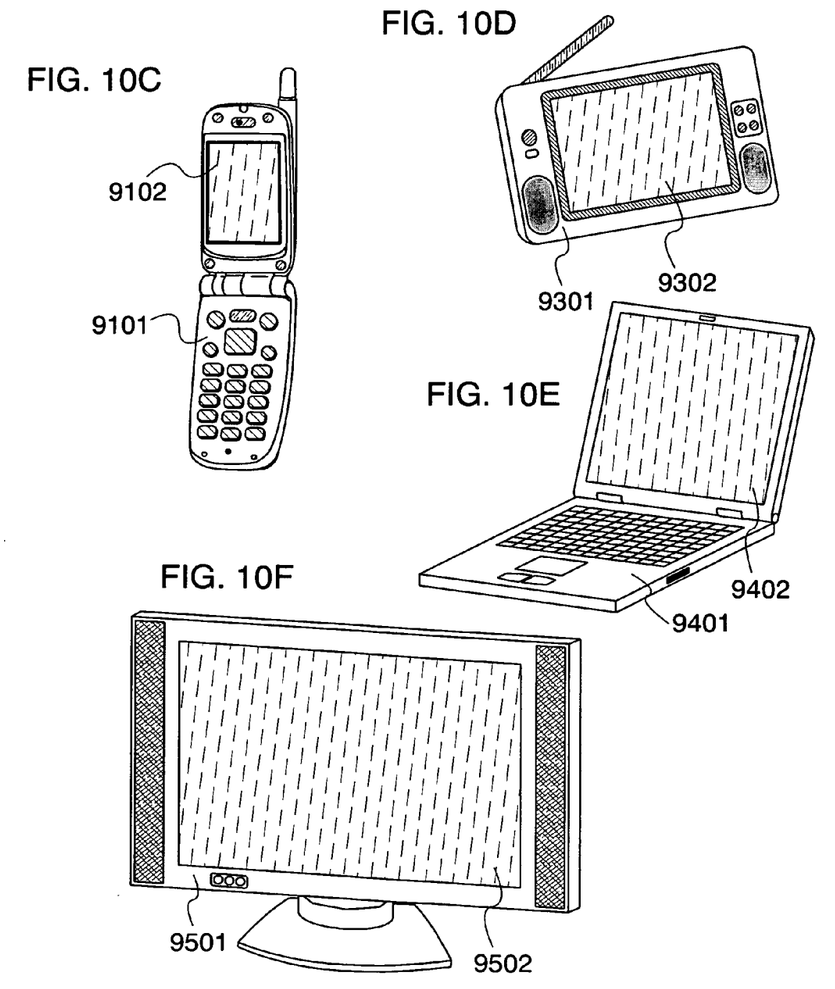

A mobile phone shown in FIG. 10C includes a body 9101, a display portion 9102, and the like. A display device of the invention can be applied to the display portion 9102.

A portable television device shown in FIG. 10D includes a main body 9301, a display portion 9302, and the like. A display device of the invention can be applied to the display portion 9302. Accordingly, a portable television device preventing a film of a partition wall from being peeled can be provided. The display device of the invention can be widely applied to various television devices such as a small-sized one mounted on a portable terminal such as a mobile phone, a medium-sized one which is portable, and a large-sized one (for example, 40 inches or more in size).

A mobile computer shown in FIG. 10E includes a body 9401, a display portion 9402, and the like. A display device of the invention can be applied to the display portion 9402.

A television device shown in FIG. 10F includes a body 9501, a display portion 9502, and the like. A display device of the invention can be applied to the display portion 9502.

Further, a semiconductor device of the invention is not limited to a display portion, and can be used as a lighting device since a light emitting element is provided in a pixel.

This application is based on Japanese Patent Application Serial No. 2006-022074 filed in Japan Patent Office on Jan. 31, 2006, the entire contents of which are hereby incorporated by reference.

What is claimed is:

1. A semiconductor device comprising:
a substrate including a first region and a second region provided in the first region;
a pixel provided in the second region, wherein the pixel contains a first pixel circuit including a first transistor, a second transistor, a gate signal line, a data signal line and a power source line, and a light emitting element electrically connected to the first pixel circuit;
a test element group for testing the first transistor and the second transistor in the second region, wherein the test element group is provided in the first region outside of the second region; and
at least one terminal provided outside of the first region, wherein the test element group includes a second pixel circuit,
wherein, in the first pixel circuit, the first transistor includes a gate connected to the gate signal line, and a source and a drain of which one is electrically connected to the data signal line and the other is electrically connected to a gate of the second transistor, and the second transistor has a source and a drain of which one is electrically connected to the power source line and the other is electrically connected to the light emitting element,
wherein at least one of first transistor and second transistor of the second pixel circuit is electrically connected to the terminal, and
wherein a potential of a gate signal line of the second pixel circuit is fixed.

2. The semiconductor device according to claim 1, wherein the first region is a vapor deposition region including a film formed by a vapor deposition method.

3. The semiconductor device according to claim 1, further comprising another substrate,
wherein the another substrate is fixed by a sealing material so as to face the substrate to seal the first region; and
wherein the terminal is provided outside of a region sealed by the another substrate and the sealing material.

4. The semiconductor device according to claim 1, wherein the semiconductor device is one selected from the group consisting of a portable information terminal, a camera, a mobile phone, a television, and a mobile computer.

5. A semiconductor device comprising:
a substrate including a first region and a second region provided in the first region;
a pixel provided in the second region, wherein the pixel contains a first pixel circuit including a first transistor, a second transistor, a gate signal line, a data signal line and a power source line, and a light emitting element electrically connected to the first pixel circuit; and
a test element group for testing the first transistor and the second transistor in the second region, wherein the test element group is provided in the first region outside of the second region,
wherein the test element group includes a second pixel circuit,
wherein, in the first pixel circuit, the first transistor includes a gate connected to the gate signal line, and a source and a drain of which one is electrically connected to the data signal line and the other is electrically connected to a gate of the second transistor, and the second transistor has a source and a drain of which one is electrically connected to the power source line and the other is electrically connected to the light emitting element,
wherein a potential of a gate signal line of the second pixel circuit is fixed.

6. The semiconductor device according to claim 5, wherein the first region is a vapor deposition region including a film formed by a vapor deposition method.

7. The semiconductor device according to claim 5, further comprising another substrate,
wherein the another substrate is fixed by a sealing material so as to face the substrate to seal the first region.

8. The semiconductor device according to claim 5, wherein the semiconductor device is one selected from the group consisting of a portable information terminal, a camera, a mobile phone, a television, and a mobile computer.

9. A semiconductor device comprising:
a substrate including a first region and a second region provided in the first region;
a pixel provided in the second region, wherein the pixel contains a first pixel circuit including a first transistor, a second transistor, a gate signal line, a data signal line and a power source line, and a light emitting element electrically connected to the first pixel circuit;
a test element group for testing the first transistor and the second transistor in the second region, wherein the test element group is provided in the first region outside of the second region; and
at least one terminal provided outside of the first region, wherein the test element group includes a second pixel circuit,
wherein, in the first pixel circuit, the first transistor includes a gate connected to the gate signal line, and a source and a drain of which one is electrically connected to the data signal line and the other is electrically connected to a gate of the second transistor, and the second transistor has a source and a drain of which one is electrically connected to the power source line and the other is electrically connected to the light emitting element,
wherein at least one of first transistor and second transistor of the second pixel circuit is electrically connected to the terminal, and
wherein a potential of a gate signal line of the second pixel circuit is fixed by using a buffer.

10. The semiconductor device according to claim 9, wherein the first region is a vapor deposition region including a film formed by a vapor deposition method.

11. The semiconductor device according to claim 9, further comprising another substrate,
wherein the another substrate is fixed by a sealing material so as to face the substrate to seal the first region; and
wherein the terminal is provided outside of a region sealed by the another substrate and the sealing material.

12. The semiconductor device according to claim 9, wherein the semiconductor device is one selected from the group consisting of a portable information terminal, a camera, a mobile phone, a television, and a mobile computer.

13. A semiconductor device comprising:
a substrate including a first region and a second region provided in the first region;
a pixel provided in the second region, wherein the pixel contains a first pixel circuit including a first transistor, a second transistor, a gate signal line, a data signal line and a power source line, and a light emitting element electrically connected to the first pixel circuit; and a test element group for testing the first transistor and the second transistor in the second region, wherein the test element group is provided in the first region outside of the second region, wherein the test element group includes a second pixel circuit, wherein, in the first pixel circuit, the first transistor includes a gate connected to the gate signal line, and a source and a drain of which one is electrically connected to the data signal line and the other is electrically connected to a gate of the second transistor, and the second transistor has a source and a drain of which one is electrically connected to the power source line and the other is electrically connected to the light emitting element, wherein a potential of a gate signal line of the second pixel circuit is fixed by a buffer.

14. The semiconductor device according to claim 13, wherein the first region is a vapor deposition region including a film formed by a vapor deposition method.

15. The semiconductor device according to claim 13, further comprising another substrate, wherein the another substrate is fixed by a sealing material so as to face the substrate to seal the first region.

16. The semiconductor device according to claim 13, wherein the semiconductor device is one selected from the group consisting of a portable information terminal, a camera, a mobile phone, a television, and a mobile computer.

* * * * *